United States Patent
Kim et al.

(10) Patent No.: US 7,808,173 B2
(45) Date of Patent: Oct. 5, 2010

(54) ORGANIC LIGHT EMITTING DISPLAY DEVICE AND METHOD OF FABRICATING THE SAME

(75) Inventors: Sun-Hwa Kim, Suwon-si (KR); Kyong-Do Kim, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 1048 days.

(21) Appl. No.: 11/378,523

(22) Filed: Mar. 16, 2006

(65) Prior Publication Data

US 2006/0208631 A1  Sep. 21, 2006

(30) Foreign Application Priority Data

Mar. 16, 2005  (KR)  .................. 10-2005-0021967

(51) Int. Cl.
*H01L 51/50* (2006.01)
(52) U.S. Cl. .................. 313/504; 313/512; 445/24; 445/25
(58) Field of Classification Search ......... 313/502–506, 313/512; 445/24–25
See application file for complete search history.

(56) References Cited

U.S. PATENT DOCUMENTS

| 6,146,225 | A * | 11/2000 | Sheats et al. ............. 445/24 |
| 6,309,486 | B1 * | 10/2001 | Kawaguchi et al. ........ 156/67 |
| 6,633,134 | B1 * | 10/2003 | Kondo et al. ............ 315/169.3 |
| 7,132,788 | B2 * | 11/2006 | Gupta et al. .............. 313/504 |
| 2002/0135297 | A1 * | 9/2002 | Maeda .................... 313/504 |
| 2003/0132446 | A1 * | 7/2003 | Guenther et al. ........... 257/88 |
| 2004/0151829 | A1 * | 8/2004 | Boroson et al. ............ 427/64 |
| 2005/0017630 | A1 * | 1/2005 | Ryu et al. ................ 313/504 |
| 2006/0138945 | A1 * | 6/2006 | Wolk et al. ............... 313/506 |

FOREIGN PATENT DOCUMENTS

| JP | 4-137485 | 5/1992 |
| JP | 4-328295 | 11/1992 |
| JP | 7-240277 | 9/1995 |

OTHER PUBLICATIONS

Patent Abstracts of Japan, Publication No. 04-137485; Publication Date: Dec. 5, 1992; in the name of Saito et al.
Patent Abstracts of Japan, Publication No. 04-328295; Publication Date: Nov. 17, 1992; in the name of Tanaka et al.
Patent Abstracts of Japan, Publication No. 07-240277; Publication Date: Dec. 9, 1995; in the name of Hosokawa et al.

* cited by examiner

*Primary Examiner*—Nimeshkumar D. Patel
*Assistant Examiner*—Mary Ellen Bowman
(74) *Attorney, Agent, or Firm*—Christie, Parker & Hale, LLP

(57) ABSTRACT

An organic light emitting display device and a method of fabricating the same are provided. The organic light emitting display device includes a substrate having first, second and third pixel regions, and an upper substrate facing the substrate. The thicknesses of regions of the upper substrate respectively facing the first, second and third pixel regions are different from each other. The thicknesses of the regions of the upper substrate facing the pixel regions are formed different from each other, such that the organic light emitting display device having an optimal or improved optical resonance structure can be provided.

17 Claims, 2 Drawing Sheets

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2005-0021967, filed Mar. 16, 2005, the entire content of which is incorporated by reference herein.

BACKGROUND OF THE INVENTION

1. Field of the Invention

The present invention relates to an organic light emitting display device and a method of fabricating the same, and more particularly, to an organic light emitting display device having an optimal (or improved) resonance structure and a method of fabricating the same.

2. Description of the Related Art

In general, an organic light emitting display device having thin film transistors for driving pixel circuits is an active matrix light emitting display device having a fast response speed as well as a wide viewing angle and excellent contrast, so that it has attracted attention as a next generation display device.

The organic light emitting display device is classified as either an inorganic electroluminescent (EL) display device or an organic EL display device according to materials used for forming an emitting layer. The organic EL display device has excellent luminance, drive voltage, and response speed characteristics, and displays many colors compared to the inorganic EL display device.

In addition, pixel regions defined by a plurality of scan lines and a plurality of data lines formed in a direction perpendicular to the direction of the scan lines may display red, green, and blue colors, so that the organic light emitting display device may constitute a full-color flat panel display device.

FIG. 1 is a schematic cross-sectional view of a conventional organic light emitting display device.

Referring to FIG. 1, the organic light emitting display device generally has a substrate 110 and an upper substrate 120 formed above the substrate 110. The upper substrate 120 covers (or encapsulates) the substrate 110 using an adhesive 130 or the like.

A red color pixel region (R), a green color pixel region (G), and a blue color pixel region (B) are disposed on the substrate 110 to display red, green, and blue colors, respectively.

A first electrode layer, an emitting layer, and a second electrode layer, which each have a predetermined pattern, are formed on the substrate 110 in each of the pixel regions. Several layers constituting each of the pixel regions are not shown in FIG. 1 for simplicity of description.

A hole injection layer and a hole transport layer may be formed as a common layer on the entire surface of the substrate having the first electrode layer. An emitting material corresponding to each of the pixel regions is stacked on the hole transport layer to form R, G, and B emitting layers.

A hole blocking layer, an electron transport layer, and an electron injection layer are sequentially formed on the entire surface of the substrate if necessary, and a second electrode layer is formed on the electron injection layer. In this case, the hole injection layer, the hole transport layer, the emitting layer, the hole block layer, the electron transport layer, and the electron injection layer are organic thin layers formed of an organic compound.

However, in a case of the full color organic light emitting display device, a difference between luminous efficiencies per pixel, i.e., per color, occurs. That is, the luminous efficiency of the green color emitting material is superior to those of the red and blue color emitting materials. In addition, the luminous efficiency of the red color emitting material is superior to that of the blue color emitting material.

Accordingly, there have been many attempts to obtain maximum efficiency and luminance by controlling the thickness of the organic thin layers in the related art. For example, Japanese Laid-Open Patent Publication No. 1992-137485 discloses a technique for enhancing the luminous efficiency by setting the thickness of an electron transport layer in a range of 30 to 60 nm in a structure sequentially having a positive electrode, a hole transport layer, an emitting layer, the electron transport layer, and a negative electrode.

In addition, Japanese Laid-Open Patent Publication No. 1992-328295 discloses a technique for substantially increasing the luminance by adjusting the thickness of an electron transport layer when light emitting from an emitting layer interferes with light reflected from a negative electrode. In addition, Japanese Laid-Open Patent Publication No. 1995-240277 discloses an organic light emitting display device for enhancing luminance and color purity of blue emission by controlling an optical layer thickness.

Such organic light emitting display devices set the optical thickness to be different from each other per color in order to enhance the luminance. However, it is difficult to entirely change the process per color to form a different optical thickness per color in a mass production process.

SUMMARY OF THE INVENTION

The present invention, therefore, provides an organic light emitting display having an optimal or improved resonance structure per each of RGB pixels and a method of fabricating the same. The RGB pixels may also be referred to as RGB sub-pixels since all three of the RGB pixels are needed to display a full color pixel.

In an exemplary embodiment according to the present invention, an organic light emitting display device includes: a substrate having a first pixel region, a second pixel region, and a third pixel region; and an upper substrate facing the substrate. In this case, thicknesses of regions of the upper substrate respectively facing the first, second and third pixel regions are different from each other.

In another exemplary embodiment according to the present invention, a method of fabricating an organic light emitting display device includes: forming a substrate having a first pixel region, a second pixel region, and a third pixel region; and disposing an upper substrate over the substrate, and encapsulating the substrate with the upper substrate. In this case, thicknesses of regions of the upper substrate respectively facing the first, second and third pixel regions are different from each other.

The upper substrate may be formed by etching or sandblasting a surface facing the substrate, or may be formed by coating the surface facing the substrate.

A difference between the thicknesses of the regions of the upper substrate facing the first and second pixel regions, respectively, may be substantially equal to a difference between optical wavelengths of lights emitted at the first and second pixel regions, and a difference between the thicknesses of the regions of the upper substrate facing the second and third pixel regions, respectively, may be substantially equal to a difference between optical wavelengths of lights emitted at the second and third pixel regions.

The first, second and third pixel regions may display different colors from each other, and each of the first, second and third pixel regions may display one color among red, green, and blue colors. In particular, the first pixel region may display a blue color, the second pixel region may display a green color, and the third pixel region may display a red color.

The upper substrate may be formed of a transparent material, and in particular, may be formed of glass or plastic.

Each of the pixel regions disposed on the substrate may include a first electrode layer formed on the substrate, an organic layer having at least an emitting layer formed on the first electrode layer, and a second electrode layer formed on the organic layer.

The first electrode layer may include a reflective electrode, and the second electrode layer may include a transparent electrode.

The first electrode layer may include a transparent electrode having a reflective layer, and the second electrode layer may include a transmissive metal electrode. The transmissive metal electrode may be one selected from the group consisting of Ca, Ca/Ag, and Mg/Ag.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
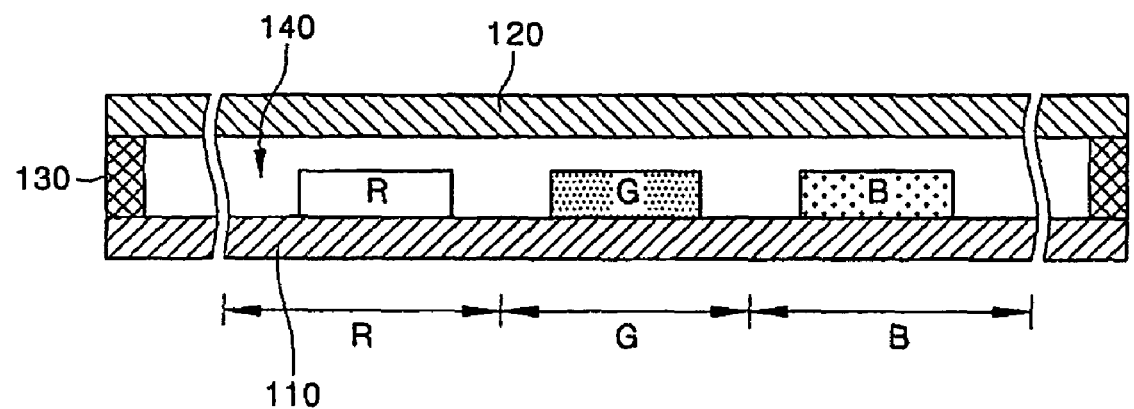
FIG. 1 is a schematic cross-sectional view of a conventional organic light emitting display device.

The present invention will now be described more fully hereinafter with reference to the accompanying drawings, in which certain exemplary embodiments of the invention are shown. This invention may, however, be embodied in different forms and should not be construed as limited to the embodiments set forth herein. Like reference numerals designate like elements throughout the specification.

Figure 2:
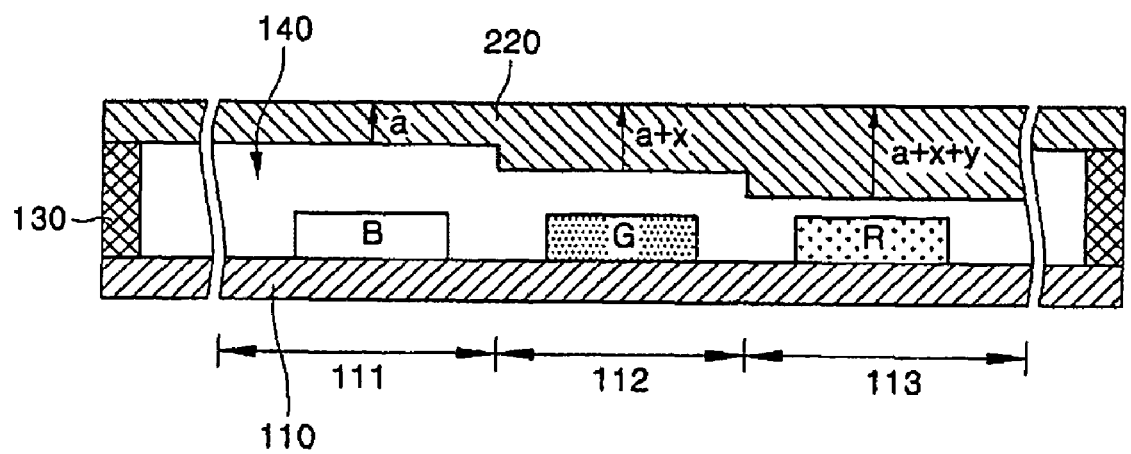
FIG. 2 is a schematic cross-sectional view illustrating an organic light emitting display device and a method of fabricating the same according to a first embodiment of the present invention.
Figure 3:
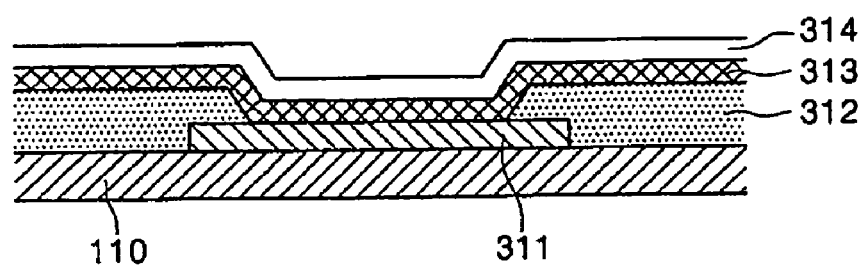
FIG. 3 is a schematic cross-sectional view of a pixel region formed on a substrate of an organic light emitting display device according to an embodiment of the present invention.

FIG. 2 is a schematic cross-sectional view illustrating an organic light emitting display device and a method of fabricating the same according to a first embodiment of the present invention, and FIG. 3 is a schematic cross-sectional view of a pixel region formed on a substrate of an organic light emitting display device according to an embodiment of the present invention.

Referring to FIG. 2, the organic light emitting display device according to the first embodiment of the present invention includes a substrate 110 and an upper substrate 220 formed on the substrate 110.

The substrate 110 has a first pixel region 111, a second pixel region 112, and a third pixel region 113.

The first pixel region 111, the second pixel region 112, and the third pixel region 113 may display different colors from each other, and each of the pixel regions may display one color among red, green, and blue colors. For example, the third pixel region displays a blue color when the first pixel region corresponds to a red color and the second pixel region corresponds to a green color, and the third pixel region displays a red color when the first pixel region corresponds to a green color and the second pixel region corresponds to a blue color. Alternatively, similar combinations of colors may be used to define the pixel regions.

In one embodiment, the first pixel region 111 displays a blue color (B), the second pixel region 112 displays a green color (G), and the third pixel region 113 displays a red color (R) because the thickness of regions of the upper substrate 220 facing (or corresponding to) each of the pixel regions increases in order of the first pixel region 111, the second pixel region 112, and the third pixel region 113. A detailed description thereof will be given later.

By way of example, a transparent insulating substrate such as a glass or plastic substrate may be used as the substrate.

Referring to FIG. 3, a first electrode layer 311 is formed in each pixel region.

The first electrode layer 311 may be formed of a reflective electrode. The reflective electrode may be formed of one or more selected from Al, an Al alloy, a double reflective layer such as Indium Tin Oxide (ITO), Indium Zinc Oxide (IZO) or the like formed on Ag, or a triple layer of Ag and ITO or the like. In addition, the first electrode layer 311 may be formed of a transparent electrode having a reflective layer.

A pixel defining layer 312 is formed on the first electrode layer 311, and then patterned to form an opening in an emitting region. An organic insulating layer such as BCB, acrylic resin or the like may be used for the pixel defining layer 312.

Subsequently, an emitting layer 313 is formed on the first electrode layer 311. That is, a first emitting material, a second emitting material, or a third emitting material is patterned to form the emitting layer 313 as one of first, second or third emitting layers on the first electrode layer 311. Each of the emitting materials may display one color among red, green, and blue colors, and may include an organic emitting material.

In one embodiment, the red color emitting layer is formed of a phosphorescent material including Carbazole BiPhenyl (CBP) or mCP as a host material, and at least one of PIQIr (acac) (bis(1-phenylisoquinoline)acetylacetonate iridium), PQIr(acac) (bis(1-phenylquinoline)acetylacetonate iridium), tris(1-phenylquinoline) iridium (PQIr) or octaethylporphyrin platinum (PtOEP) as a dopant material. The red color emitting layer may be formed of a fluorescent material such as PBD:Eu(DBM)3(Phen) or Perylene.

In one embodiment, the green color emitting layer is formed of a phosphorescent material including CBP or mCP as a host material, and Ir(ppy)3 (fac tris(2-phenylpyridine) iridium) as a dopant material.

In addition, the green color emitting layer may be formed of a fluorescent material such as Alq3(tris(8-hydroxyquinolino)aluminum).

In one embodiment, the blue color emitting layer is formed of a fluorescent material including one material selected from DPVBi, spiro-DPVBi, spiro-6P, distyryl benzene (DSB), distyryl arylene (DSA), poly(9,9-di-n-octyl-2,7-fluorene) (PFO) polymer, and poly-paraphenylene vinylene (PPV) polymer. When the blue color emitting layer is formed of a phosphorescent material, the optical characteristics may be unstable, so that it is formed of the above-described fluorescent materials.

These emitting layers may be formed by a typical method such as a Laser Induced Thermal Imaging (LITI) method, an inkjet method, or an evaporation method.

A second electrode layer 314 is formed on the emitting layer 313. The second electrode layer 314 may be formed of a transparent electrode or a transmissive metal electrode. In particular, the transmissive metal electrode may be formed of one of Ca, Ca/Ag, or Mg/Ag.

At least one layer of a hole injection layer or a hole transport layer may be formed under the emitting layer 313 in the exemplary organic light emitting display device of the present invention, and at least one layer of a hole blocking layer, an electron transport layer, or an electron injection layer may be further formed on the emitting layer 313.

Referring back to FIGS. 2 and 3, the upper substrate 220 is formed above the substrate 110, and covers (or encapsulates) the substrate 110 using an adhesive 130.

A space (or gap) 140 between the substrate 110 and the upper substrate 220 may be filled with air, and a protection layer may be formed to protect elements formed on the substrate 110. In this case, the space 140 between the substrate 110 and the upper substrate 220 is not taken into account when an optical path to be described later is applied thereto.

In one embodiment, the upper substrate 220 is formed of a transparent material, and in particular, glass or plastic.

In this case, thicknesses of the regions of the upper substrate 220 facing the first pixel region 111, the second pixel region 112, and the third pixel region 113 are different from each other. The thicknesses of the regions of the upper substrate 220 facing the pixel regions are made different from each other in the described embodiment in order to have an optimal or improved resonance structure for the pixel regions.

In more detail, wavelength ranges when the red, green, and blue colors have the respective maximum intensities are different from each other. For example, a wavelength range corresponds to 460 nm at the time of the maximum intensity of the blue color, 520 nm at the time of the maximum intensity of the green color, and 630 nm at the time of the maximum intensity of the red color. In this case, if an optical path length between the emitting layer and the upper substrate 220 (a of the first pixel region 111), that is, an optical thickness of the upper substrate 220, is the same for each color, a difference between movement distances of the light according to the wavelength occurs so that an optical characteristic may not be optimally obtained.

Accordingly, the difference between the wavelength ranges at the time of the maximum intensities of the respective colors is taken into account, so that the optical path lengths between the emitting layer and the upper substrate 220, i.e., the optical thicknesses of regions of the upper substrate 220 that correspond to different color pixel regions are made different from each other in the described embodiment to obtain an optimal (or improved) optical resonance structure.

According to the described embodiment, in order to have the optimal (or improved) optical resonance structure, the optical path difference between the emitting layer and the upper substrate 220 of two pixel regions adjacent to each other, i.e., the difference between optical thicknesses of two regions of the upper substrate 220, is made substantially equal to a wavelength difference when colors of the two pixel regions have the maximum intensities.

For example, when a difference between the wavelength when the color of the first pixel region 111 has the maximum intensity and the wavelength when the color of the second pixel region 112 has the maximum intensity is x, a difference between the optical path length between the emitting layer of the first pixel region 111 and the upper substrate 220, and the optical path length between the emitting layer of the second pixel region 112 and the upper substrate 220, becomes x. That is, when the optical path length of the first pixel region 111 corresponds to a, the optical path length of the second pixel region 112 corresponds to a+x. Accordingly, the difference of the optical thicknesses of the upper substrate 220 facing the first and second pixel regions 111 and 112, becomes x.

Accordingly, when the difference between the optical thicknesses of the regions of the upper substrate 220 respectively facing the first and second pixel regions 111 and 112 is made to be x, an optimal (or improved) optical resonance structure may be obtained.

In a similar manner, when a wavelength difference when the colors of the second and third pixel regions 112 and 113 adjacent to each other have the maximum intensities is y, a difference between the optical path length between the emitting layer of the second pixel region 112 and the upper substrate 220, and the optical path length between the emitting layer of the third pixel region 113 and the upper substrate 220, becomes y, so that a difference between the optical thicknesses of the upper substrate 220 becomes y. Accordingly, when the difference of the optical thicknesses of the upper substrate 220 facing the second and third pixel regions 112 and 113 is made to be y, an optimal (or improved) optical resonance structure may be obtained.

As described above, when the first, second and third pixel regions display the blue, green, and red colors, respectively, the thickness of the region of the upper substrate 220 facing the first pixel region 111 is the thinnest. And thicknesses of the corresponding regions of the upper substrate 220 are adjusted to be larger in an order of the second pixel region and the third pixel region to obtain the optimal (or improved) resonance structure.

Here, regions of the upper substrate 220 facing the first to third pixel regions may have different thicknesses from each other by using etching or sandblast method.

The etching method may use dry etching or wet etching. The dry etching is an etching method using a physical method by means of ion impact or using a method of concurrently applying two phenomena like physical and chemical reactions as a chemical reaction of reactive materials generated in plasma or as a chemical reaction carried out by ions, electrons, photons or the like. The wet etching is a method using a chemical solution to remove the upper substrate 220 to comply with a photoresist pattern, and dipping and spraying, or a mixed one thereof may be employed for the wet etching as those skilled in the art would know.

The sandblast method is a method which sprays or projects sand or pebble to a structure using pressure or centrifugal force at a high speed to process a surface of the structure in a desired shape.

Figure 4:
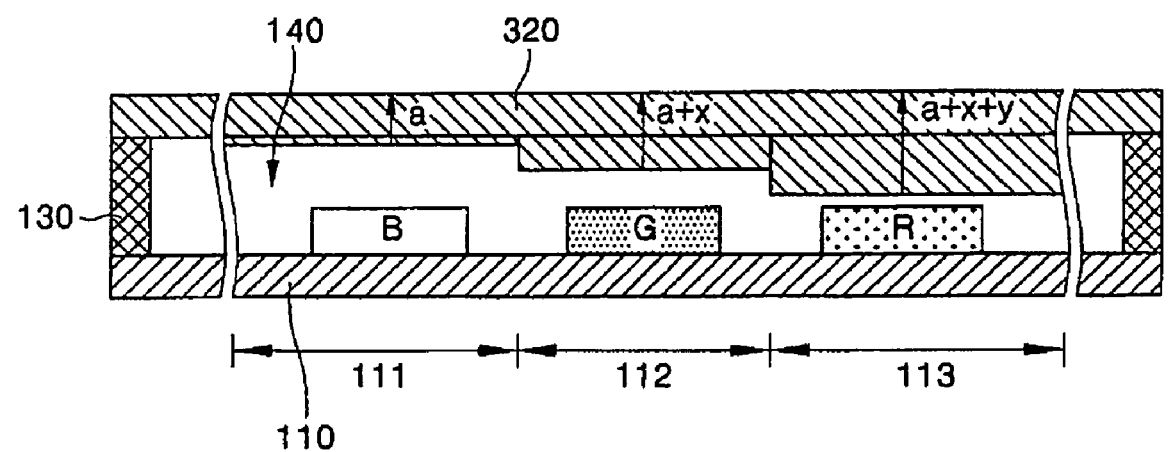
FIG. 4 is a schematic cross-sectional view illustrating an organic light emitting display device and a method of fabricating the same according to a second embodiment of the present invention.

FIG. 4 is a schematic cross-sectional view illustrating an organic light emitting display device and a method of fabricating the same in accordance with a second embodiment of the present invention.

Referring to FIG. 4, the organic light emitting display device according to the second embodiment of the present invention includes a substrate 110 and an upper substrate 320 formed above the substrate 110.

The substrate 110 has a first pixel region 111, a second pixel region 112, and a third pixel region 113. The upper substrate 320 covers the substrate 110 using an adhesive 130.

Thicknesses of the regions of the upper substrate 320 facing the first pixel region 111, the second pixel region 112, and the third pixel region 113 are different from each other. The thicknesses of the upper substrate 320 facing the pixel regions are made different from each other in the described embodiment of the present invention in order to have an optimal (or improved) resonance structure, respectively.

Accordingly, optical path lengths between the emitting layer and the upper substrate 320, i.e., optical thicknesses of regions of the upper substrate 320, are made different from each other per color to obtain an optimal (or improved) optical resonance structure.

In this case, the regions of the upper substrate 320 facing the respective first, second and third pixel regions are subjected to coating to have different thicknesses from each other in the second embodiment of the present invention.

The upper substrate 320 may use glass or plastic as a transparent material, and the coating material used for the coating method may use the same material as the upper substrate 320. That is, the glass or plastic may be used.

The organic light emitting display device and the method of fabricating the same for the second embodiment of FIG. 4 are substantially the same as those of the first embodiment of FIG. 2, except as described above.

According to the described embodiments of the present invention, thicknesses of regions of an upper substrate facing respective pixel regions are made different from each other, so that an organic light emitting display device having an optimal (or improved) optical resonance structure may be provided.

Although the present invention has been described with reference to certain exemplary embodiments thereof, it will be understood by those skilled in the art that a variety of modifications and variations may be made to the present invention without departing from the spirit or scope of the present invention defined by the appended claims, and their equivalents.

What is claimed is:

1. An organic light emitting display device, comprising:
    a lower substrate having a first pixel region, a second pixel region, and a third pixel region for emitting light; and
    an upper substrate facing the lower substrate and spaced apart from the first, second and third pixel regions,
    wherein thicknesses of regions of the upper substrate respectively facing the first, second and third pixel regions are different from each other.

2. The organic light emitting display device according to claim 1, wherein a difference between the thicknesses of the regions of the upper substrate facing the first and second pixel regions, respectively, is substantially equal to a difference between optical wavelengths of lights emitted at the first and second pixel regions, and a difference between the thicknesses of the regions of the upper substrate facing the second and third pixel regions, respectively, is substantially equal to a difference between optical wavelengths of lights emitted at the second and third pixel regions.

3. The organic light emitting display device according to claim 2, wherein the differences between the optical wavelengths of the lights are differences between the optical wavelengths at their respective maximum intensities.

4. The organic light emitting display device according to claim 1, wherein each of the pixel regions of the lower substrate includes:
    a first electrode layer on the lower substrate;
    an organic layer having at least an emitting layer for emitting red, green, or blue light on the first electrode layer; and
    a second electrode layer on the organic layer.

5. The organic light emitting display device according to claim 4, wherein the first electrode layer comprises a reflective electrode and the second electrode layer comprises a transparent electrode.

6. The organic light emitting display device according to claim 4, wherein the first electrode layer comprises a transparent electrode having a reflective layer and the second electrode layer comprises a transmissive metal electrode which is one selected from the group consisting of Ca, Ca/Ag, and Mg/Ag.

7. The organic light emitting display device according to claim 1, wherein the first, second and third pixel regions are respectively configured to emit blue, green and red light, wherein the thickness of the region of the upper substrate facing the first pixel region is less than the thickness of the region of the upper substrate facing the second pixel region, and wherein the thickness of the region of the upper substrate facing the second pixel region is less than the thickness of the region of the upper substrate facing the third pixel region.

8. A method of fabricating an organic light emitting display device, comprising:
    forming a lower substrate having a first pixel region, a second pixel region, and a third pixel region for emitting light; and
    forming an upper substrate over the lower substrate and spaced apart from the first, second and third pixel regions, and encapsulating the lower substrate with the upper substrate,
    wherein thicknesses of regions of the upper substrate respectively facing the first, second and third pixel regions are different from each other.

9. The method according to claim 8, wherein a difference between the thicknesses of the regions of the upper substrate facing the first and second pixel regions, respectively, is substantially equal to a difference between optical wavelengths of lights emitted at the first and second pixel regions, and a difference between the thicknesses of the regions of the upper substrate facing the second and third pixel regions, respectively, is substantially equal to a difference between optical wavelengths of lights emitted at the second and third pixel regions.

10. The method according to claim 9, wherein the differences between the optical wavelengths of the lights are differences between the optical wavelengths at their respective maximum intensities.

11. The method according to claim 8, wherein the upper substrate is formed by etching or sandblasting a surface of the upper substrate facing the lower substrate.

12. The method according to claim 11, wherein the first, second and third pixel regions respectively correspond to blue, green and red pixel regions, and wherein said forming the upper substrate comprises: forming the region of the upper substrate facing the second pixel region to have a thickness less than a thickness of the region of the upper substrate facing the third pixel region; and forming the region of the upper substrate facing the first pixel region to have a thickness less than the thickness of the region of the upper substrate facing the second pixel region.

13. The method according to claim 8, wherein the upper substrate is formed by coating a surface of the upper substrate facing the lower substrate.

14. The method according to claim 13, wherein the first, second and third pixel regions respectively correspond to blue, green and red pixel regions, and wherein said forming the upper substrate comprises: forming the region of the upper substrate facing the second pixel region to have a thickness greater than a thickness of the region of the upper substrate facing the first pixel region; and forming the region of the upper substrate facing the third pixel region to have a thickness greater than the thickness of the region of the upper substrate facing the second pixel region.

15. The method according to claim 8, wherein each of the pixel regions of the lower substrate includes:
- a first electrode layer on the lower substrate;
- an organic layer having at least an emitting layer for emitting red, green or blue light on the first electrode layer; and
- a second electrode layer on the organic layer.

16. The method according to claim 15, wherein the first electrode layer comprises a reflective electrode and the second electrode layer comprises a transparent electrode.

17. The method according to claim 15, wherein the first electrode layer comprises a transparent electrode having a reflective layer and the second electrode layer comprises a transmissive metal electrode which is one selected from the group consisting of Ca, Ca/Ag, and Mg/Ag.

* * * * *

UNITED STATES PATENT AND TRADEMARK OFFICE
CERTIFICATE OF CORRECTION

| | | |
|---|---|---|
| PATENT NO. | : 7,808,173 B2 | Page 1 of 1 |
| APPLICATION NO. | : 11/378523 | |
| DATED | : October 5, 2010 | |
| INVENTOR(S) | : Sun-Hwa Kim et al. | |

It is certified that error appears in the above-identified patent and that said Letters Patent is hereby corrected as shown below:

On the Title Page

Item (56) References Cited
OTHER PUBLICATIONS, Ref. 1,
line 1                            Delete "Dec. 5, 1992"
                                          Insert -- May 12, 1992 --

Item (56) References Cited
OTHER PUBLICATIONS, Ref. 3,
line 2                            Delete "Dec. 9, 1995"
                                          Insert -- Sept. 12, 1995 --

Signed and Sealed this
Seventh Day of February, 2012

David J. Kappos
*Director of the United States Patent and Trademark Office*